(12) United States Patent
Gomes et al.

(10) Patent No.: US 11,018,264 B1
(45) Date of Patent: May 25, 2021

(54) THREE-DIMENSIONAL NANORIBBON-BASED LOGIC

(71) Applicant: Intel Corporation, Santa Clara, CA (US)

(72) Inventors: Wilfred Gomes, Portland, OR (US);
Kinyip Phoa, Beaverton, OR (US);
Tahir Ghani, Portland, OR (US);
Rajesh Kumar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/715,135

(22) Filed: Dec. 16, 2019

(51) Int. Cl.
*H01L 29/786* (2006.01)
*H01L 29/423* (2006.01)
*H01L 21/8234* (2006.01)
*H01L 23/535* (2006.01)
*H01L 27/088* (2006.01)

(52) U.S. Cl.
CPC ............... *H01L 29/78696* (2013.01); *H01L 21/823475* (2013.01); *H01L 23/535* (2013.01); *H01L 27/088* (2013.01); *H01L 29/42392* (2013.01)

(58) Field of Classification Search
CPC ......... H01L 29/42392; H01L 29/78696; H01L 27/088
See application file for complete search history.

(56) References Cited

U.S. PATENT DOCUMENTS

2018/0122793 A1* 5/2018 Moroz ................ H01L 29/4238

* cited by examiner

*Primary Examiner* — Changhyun Yi
(74) *Attorney, Agent, or Firm* — Patent Capital Group

(57) ABSTRACT

Described herein are three-dimensional nanoribbon-based logic ICs that include one of more of 1) individual gate control in a vertical stack of nanoribbons, 2) inter-ribbon interconnects in a vertical stack of nanoribbons, and 3) both P- and N-type nanoribbons in a vertical stack of nanoribbons. Using one or more of these features may help realize unique monolithic 3D logic architectures that were not possible with conventional logic circuits and may allow realizing logic devices with favorable metrics in terms of power and performance while preserving the substrate area and cost.

20 Claims, 11 Drawing Sheets

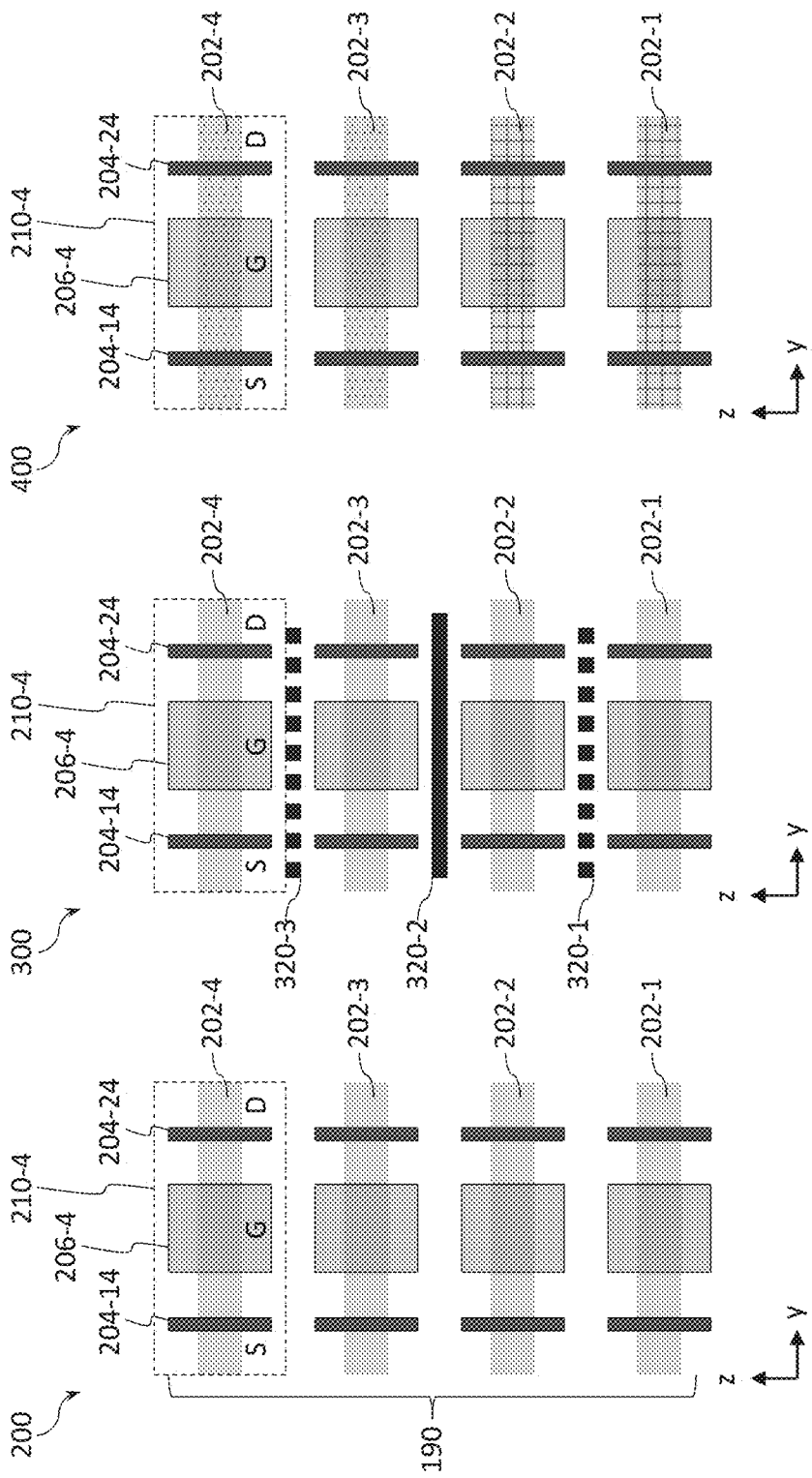

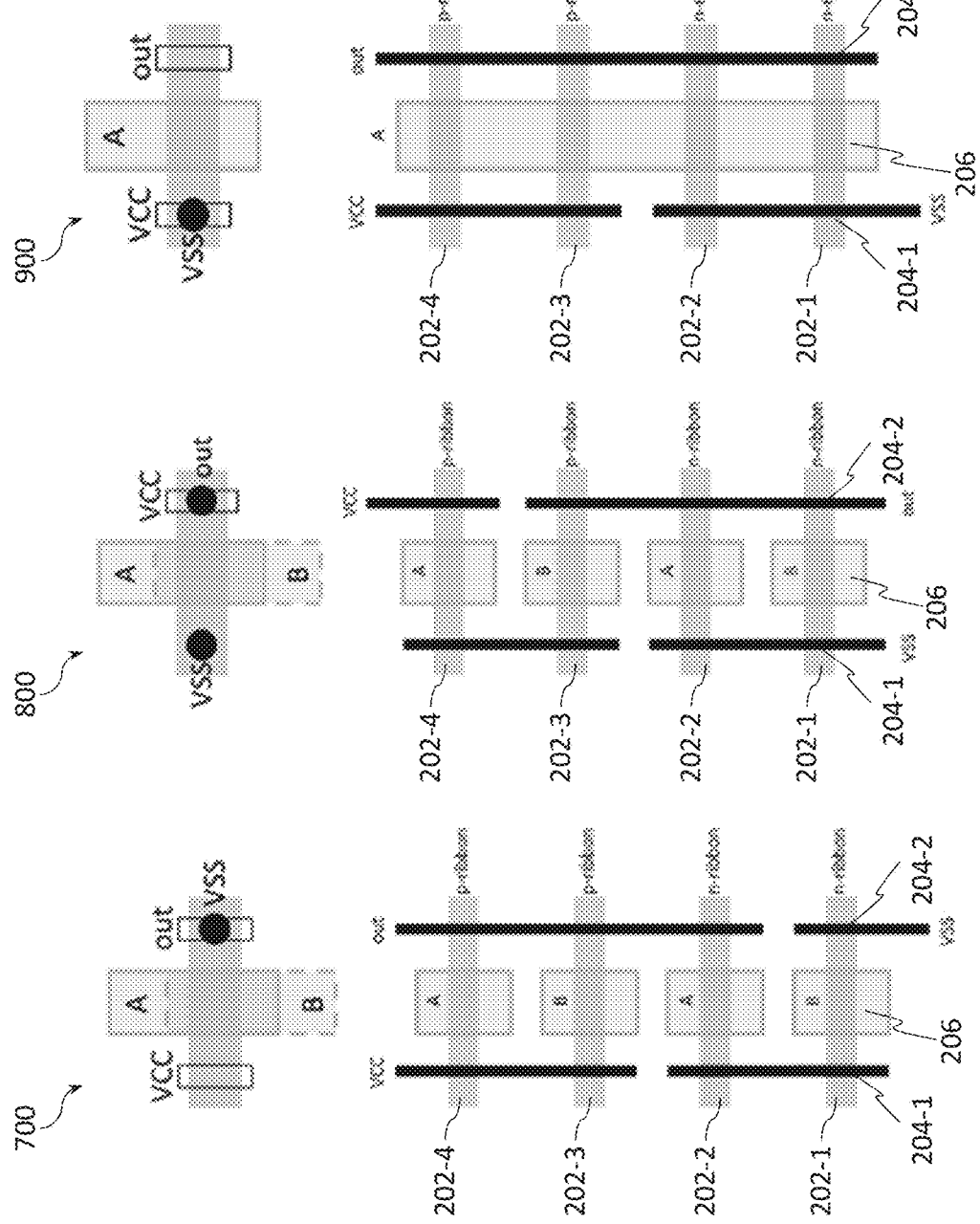

THREE-DIMENSIONAL NANORIBBON-BASED LOGIC

BACKGROUND

Monolithic integrated circuits (ICs) generally include a number of transistors, such as metal-oxide-semiconductor (MOS) field-effect transistors (FETs) (MOSFETs), fabricated over a planar substrate, such as a silicon wafer. While Moore's Law has held true for decades within the IC industry, lateral scaling of IC dimensions is becoming more difficult with MOSFET gate dimensions now below 20 nanometers. As device sizes continue to decrease, there will come a point where it becomes impractical to continue standard planar scaling. This inflection point could be due to economics or physics, such as prohibitively high capacitance, or quantum-based variability. Stacking of transistors in a third dimension, typically referred to as vertical scaling, or three-dimensional (3D) integration, is therefore a promising path toward greater transistor density.

While 3D integration may be achieved at a package level, for example by stacking separately manufactured chips, a monolithic 3D approach offers the greatest inter-layer interconnect density, allowing 3D circuits, such as 3D logic circuits, to be constructed at the lowest level and the tightest circuit density. Realizing a monolithic 3D IC architecture with favorable metrics in terms of power, performance, and footprint area is not a trivial task and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 2 provides a schematic illustration of a 3D nanoribbon-based IC device with individually controllable gates in a vertical stack of nanoribbons, according to some embodiments of the present disclosure.

FIG. 3 provides a schematic illustration of a 3D nanoribbon-based IC device with interconnects between nanoribbons in a vertical stack of nanoribbons, according to some embodiments of the present disclosure.

FIG. 4 provides a schematic illustration of a 3D nanoribbon-based IC device with both P- and N-type nanoribbons in a vertical stack of nanoribbons, according to some embodiments of the present disclosure.

FIG. 7 provides top-down and cross-sectional views of a 3D nanoribbon-based IC device implementing an example NAND logic, according to some embodiments of the present disclosure.

FIG. 8 provides top-down and cross-sectional views of a 3D nanoribbon-based IC device implementing an example NOR logic, according to some embodiments of the present disclosure.

FIG. 9 provides top-down and cross-sectional views of a 3D nanoribbon-based IC device implementing an example Invert (INV) logic, according to some embodiments of the present disclosure.

DETAILED DESCRIPTION

Overview

Figure 1:
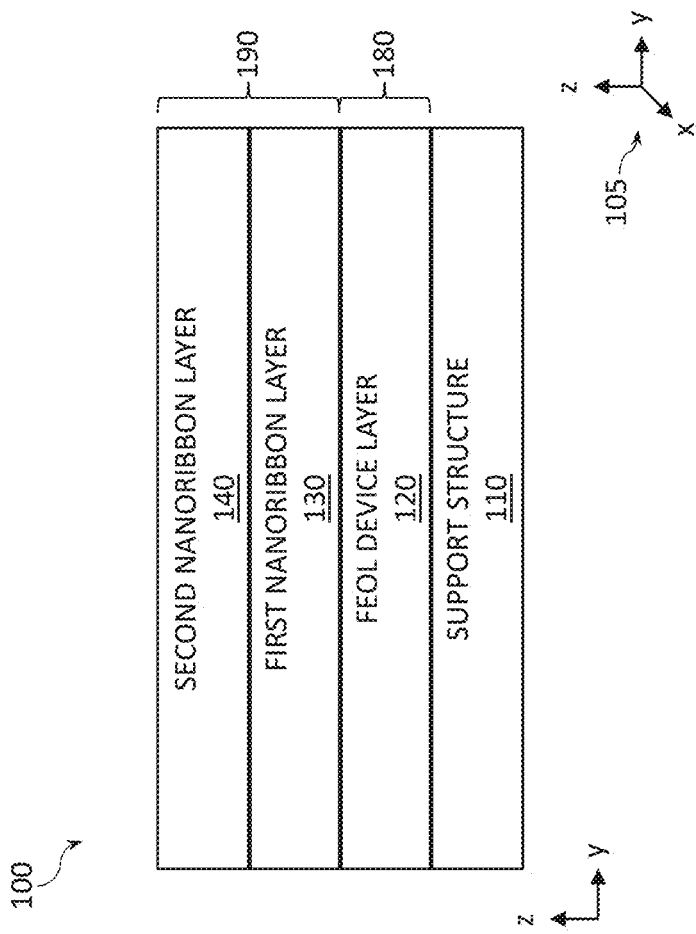
FIG. 1 provides a schematic illustration of an IC device with multiple layers of nanoribbons for realizing 3D nanoribbon-based logic, according to some embodiments of the present disclosure.

Embodiments of the present disclosure are based on using semiconductor nanoribbons stacked above one another to realize high-density 3D logic. In the context of the present disclosure, the term "above" may refer to being further away from a support structure (e.g., a substrate, a chip, or a wafer) or front-end-of-line (FEOL) of an IC device, while the term "below" refers to being closer toward the support structure or the FEOL of the IC device. Furthermore, as used herein, the term "nanoribbon" refers to an elongated semiconductor structure having a long axis parallel to a support structure over which a logic device is provided. In some settings, the term "nanoribbon" has been used to describe an elongated semiconductor structure that has a rectangular transverse cross-section (i.e., a cross-section in a plane perpendicular to the longitudinal axis of the structure), while the term "nanowire" has been used to describe a similar structure but with a circular transverse cross-section. In the present disclosure, the term "nanoribbon" is used to describe both such nanoribbons and such nanowires, as well as elongated semiconductor structures with a longitudinal axis parallel to the support structures and with having transverse cross-sections of any geometry (e.g., oval, or a polygon with rounded corners).

An example 3D nanoribbon-based logic device (also interchangeably referred to herein as "3D nanoribbon-based logic") may include one of more of 1) individual gate control in a vertical stack of nanoribbons, 2) inter-ribbon interconnects in a vertical stack of nanoribbons, and 3) both P- and N-type nanoribbons in a vertical stack of nanoribbons. Using one or more of these features may provide several advantages and may help realize unique monolithic 3D logic architectures that were not possible with conventional, FEOL logic transistors. One advantage is that nanoribbon-based transistors may be moved to the back end of line (BEOL) layers of an advanced complementary metal-oxide-semiconductor (CMOS) process. Moving transistors of logic devices to the BEOL layers means may allow significantly increasing density of logic devices having a given footprint area (the footprint area being defined as an area in a plane of the substrate, or a plane parallel to the plane of the substrate, i.e., the x-y plane of an example coordinate system shown in the drawings of the present disclosure), or, conversely, allows significantly reducing the footprint area of a structure with a given density of logic devices. In addition, nanoribbon-based transistors may have improved performance compared to conventional FEOL transistors, or transistors of other architectures. Furthermore, providing independent gate control, inter-ribbon interconnects, and a combination of P- and N-type nanoribbons may advantageously allow realizing logic devices with favorable metrics in terms of power and performance while preserving the substrate area and cost. Other technical effects will be evident from various embodiments described here.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 10A-10B, such a collection may be referred to herein without the letters, e.g., as "FIG. 10."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with 3D nanoribbon-based logic as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Layering

FIG. 1 provides a schematic illustration of a cross-sectional view of an example IC device 100 with multiple layers of nanoribbons for realizing 3D nanoribbon-based logic. As shown in FIG. 1, in general, the IC device 100 may include a support structure 110, a FEOL device layer 120, a first nanoribbon layer 130, and a second nanoribbon layer 140.

Implementations of the present disclosure may be formed or carried out on the support structure 110, which may be, e.g., a substrate, a die, a wafer or a chip. The support structure 110 may, e.g., be the wafer 2000 of FIG. 10A, discussed below, and may be, or be included in, a die, e.g., the singulated die 2002 of FIG. 10B, discussed below. The support structure 110 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 110 may be a printed circuit board (PCB) substrate. Although a few examples of materials from which the substrate may be formed are described here, any material that may serve as a foundation upon which a semiconductor device implementing any of the 3D nanoribbon-based logic devices as described herein may be built falls within the spirit and scope of the present disclosure.

The first and second nanoribbon layers 130, 140 may, together, be seen as forming a vertical stack 190 of nanoribbons, the stack 190 extending in the direction perpendicular to the support structure 110 (i.e., extending in the direction of the z-axis of the example coordinate system 105 shown in FIG. 1). By implementing one or more of independent gate control as schematically illustrated in FIG. 2, inter-ribbon interconnects as schematically illustrated in FIG. 3, and a combination of P- and N-type nanoribbons as schematically illustrated in FIG. 4 in portions of the vertical stack 190, various 3D nanoribbon-based logic devices with improved metrics may be realized. Some examples of such devices are shown in FIGS. 5-9. On the other hand, the FEOL layer 120 may be a compute logic layer in that it may include various logic layers, circuits, and devices (e.g., logic transistors) to drive and control a logic IC. For example, the logic devices of the compute logic layer 120 may form a peripheral circuit 180 to control the logic devices implemented in the vertical nanoribbon stack 190. In various embodiments of the IC device 100, compute logic devices may be distributed among the FEOL 120 and the nanoribbon layers 130, 140. It should be noted that although descriptions of the present disclosure may refer to logic devices provided in a given layer or a combination of layers of the IC device 100, each layer or each combination of layers of the IC devices described herein may also include other types of devices besides logic devices. For example, in some embodiments, IC devices with 3D nanoribbon-based logic may also include memory cells, e.g., DRAM or SRAM memory cells, or any other type of memory cells, in any of the layers.

In some embodiments, the FEOL layer 120 may be provided in a FEOL and in one or more lowest BEOL layers (i.e., in one or more BEOL layers which are closest to the support structure 110), while the first nanoribbon layer 130 and the second nanoribbon layer 140 may be seen as provided in respective BEOL layers. Various BEOL layers may be, or include, metal layers. As used herein, the term "metal layer" may refer to a layer above a support structure that includes electrically conductive interconnect structures for providing electrical connectivity between different IC components. Metal layers described herein may also be referred to as "interconnect layers" to clearly indicate that these layers include electrically conductive interconnect structures which may but does not have to be metal. Various metal layers of the BEOL may be used to interconnect the various inputs and outputs of the logic devices in the FEOL layer 120 and/or of the logic devices in the nanoribbon layers 130, 140. Generally speaking, each of the metal layers of the BEOL may include a via portion and a trench/interconnect portion. The trench portion of a metal layer may be configured for transferring signals and power along electrically conductive (e.g., metal) lines (also sometimes referred to as "trenches") extending in the x-y plane (e.g., in the x or y directions) of the coordinate system 105, while the via portion of a metal layer is configured for transferring signals and power through electrically conductive vias extending in the z-direction of the coordinate system 105, e.g., to any of the adjacent metal layers above or below. Accordingly, vias connect metal structures (e.g., metal lines or vias) from one metal layer to metal structures of an adjacent metal layer. While referred to as "metal" layers, various layers of the BEOL may include only certain patterns of conductive metals, e.g., copper (Cu), aluminum (Al), Tungsten (W), or Cobalt (Co), or metal alloys, or more generally, patterns of an electrically conductive material, formed in an insulating medium such as an interlayer dielectric (ILD). The insulating medium may include any suitable ILD materials such as silicon oxide, carbon-doped silicon oxide, silicon carbide, silicon nitride, aluminum oxide, and/or silicon oxynitride.

The illustration of FIG. 1 is intended to provide a general orientation and arrangement of various layers with respect to one another, and, unless specified otherwise in the present disclosure, includes embodiments of the IC device 100 where portions of elements described with respect to one of the layers shown in FIG. 1 may extend into one or more, or be present in, other layers. For example, power and signal interconnects for the various components of the IC device 100 may be present in any of the layers shown in FIG. 1, although not specifically illustrated in FIG. 1. Furthermore, although two nanoribbon layers 130, 140 are shown in FIG. 1, in various embodiments, the IC device 100 may include any other number of one or more of such nanoribbon layers.

Three Features to Realize 3D Nanoribbon-Based Logic

Various 3D nanoribbon-based logic ICs described herein are based on include one of more of three features: 1) individual gate control in a vertical stack of nanoribbons, 2) inter-ribbon interconnects in a vertical stack of nanoribbons, and 3) both P- and N-type nanoribbons in a vertical stack of nanoribbons, shown, respectively, in FIGS. 2-4.

FIG. 2 provides a schematic illustration of a 3D nanoribbon-based IC device 200 with individually controllable gates in a vertical stack of nanoribbons, according to some embodiments of the present disclosure. The IC device 200 may be one example of the IC device 100, shown in FIG. 1, although not all details of the IC device 100 are specifically shown in FIG. 2, but, rather, only an example implementation of the vertical stack 190. Therefore, all of the descriptions provided with respect to the IC device 100 are applicable to the IC device 200 and, in the interests of brevity, are not repeated.

FIG. 2 illustrates an embodiment where the vertical stack 190 may include four nanoribbons 202, labeled as nanoribbons 202-1, 202-2, 202-3, and 202-4. A transistor 210 may be implemented in each nanoribbon 202 (although the reference numeral "210" is only shown in FIG. 2 for one of the nanoribbons 202, in order to not clutter the drawing), the transistor 210 including a pair of source and drain regions 204, and a gate stack 206 provided over a portion of the nanoribbon between a source region and a drain region. The transistor 210 is a nanoribbon-based transistor (or, simply, a nanoribbon transistor, e.g., a nanowire transistor). In a nanoribbon transistor, a gate stack 206 that may include a stack of one or more gate stack electrode metals and, optionally, a stack of one or more gate stack dielectrics may be provided around a portion of an elongate semiconductor structure 202 called "nanoribbon", forming a gate stack on all sides of the nanoribbon 202. A portion of the nanoribbon 202 around which the gate stack 206 wraps around is referred to as a "channel" or a "channel portion." A semiconductor material of which the channel portion of the nanoribbon 202 is formed is commonly referred to as a "channel material." A source region and a drain region, 204, are provided on the opposite ends of the nanoribbon, on either side of the gate stack 206, forming, respectively, a source and a drain of such a transistor. Wrap-around or all-around gate stack transistors, such as nanoribbon and nanowire transistors, may provide advantages compared to other transistors having a non-planar architecture, such as FinFETs, as well as over transistors having planar architecture. Although a single transistor 210 in each of the nanoribbons 202 is illustrated in FIG. 2, this is simply for ease of illustration, and, in other embodiments, any greater number of transistors 210 may be provided along a single nanoribbon 202 according to various embodiments of the present disclosure.

The arrangement shown in FIG. 2 (and other figures of the present disclosure) is intended to show relative arrangements of some of the components therein, and the arrangement of the IC device 200 (in particular, of the transistor 210), or portions thereof, may include other components that are not illustrated (e.g., electrical contacts to the source and the drain of the transistor 210, additional layers such as a spacer layer, around the gate electrode of the transistor 210, etc.). For example, although not specifically illustrated in FIG. 2, a dielectric spacer may be provided between the source electrode and the gate stack 206 as well as between the transistor drain electrode and the gate stack 206 of the all-around-gate transistors 210 in order to provide electrical isolation between the source, gate, drain electrodes. In another example, although not specifically illustrated in FIG. 2, at least portions of the transistor 210 may be surrounded in an insulator material, such as any suitable ILD material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the transistor 210 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass.

Each of the nanoribbons 202 may take the form of a nanowire or nanoribbon, for example. In some embodiments, the nanoribbons 202 may have a rectangular or a square cross-section (not specifically shown in FIG. 2 because FIG. 2 does not illustrate a cross-section in the x-z plane). In other embodiments, the nanoribbon 202 may instead have a cross-section that is rounded at corners or otherwise irregularly shaped, and the gate stack 206 may conform to the shape of the nanoribbon 202. In use, the all-around-gate transistor 210 may form conducting channels on more than three "sides" of the nanoribbon 202, potentially improving performance relative to FinFETs. Furthermore, although FIG. 2, as well as the other drawings of the present disclosure, depict embodiments in which the longitudinal axis of the nanoribbon 202 runs substantially parallel to a plane of the support structure 110, this need not be the case; in other embodiments, the nanoribbon 202 may be oriented, e.g., "vertically" so as to be perpendicular to a plane of the support structure 110.

In some embodiments, the channel material of the nanoribbon 202 may be composed of semiconductor material systems including, for example, N-type or P-type materials systems. In some embodiments, the channel material of the nanoribbon 202 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material of the nanoribbon 202 may include a combination of semiconductor materials. In some embodiments, the channel material of the nanoribbon 202 may include a monocrystalline semiconductor, such as silicon (Si) or germanium (Ge). In some embodiments, the channel material of the nanoribbon 202 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the transistor 210 is an N-type metal-oxide-semiconductor (NMOS)), the channel material of the nanoribbon 202 may advantageously include a III-V material having a high electron mobility, such as, but not limited to InGaAs, InP, InSb, and InAs. For some such embodiments, the channel material of the nanoribbon 202 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel material of the nanoribbon 202 may be an intrinsic III-V material, i.e., a III-V semiconductor material not intentionally doped with any electrically active impurity. In alternate embodiments, a nominal impurity dopant level may be present within the channel material of the nanoribbon 202, for example to further fine-tune a threshold voltage Vt, or to provide HALO pocket implants, etc. Even for impurity-doped embodiments however, impurity dopant level within the channel material of the nanoribbon 202 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where the transistor 210 is a P-type metal-oxide-semiconductor (PMOS)), the channel material of the nanoribbon 202 may advantageously be a group IV material having a high hole mobility, such as, but not limited to Ge or a Ge-rich SiGe alloy. For some example embodiments, the channel material of the nanoribbon 202 may have a Ge content between 0.6 and 0.9, and advantageously may be at least 0.7. In some embodiments with highest mobility, the channel material of the nanoribbon 202 may be intrinsic III-V (or IV for P-type devices) material and not intentionally doped with any electrically active impurity. In alternate embodiments, one or more a nominal impurity dopant level may be present within the channel material of the nanoribbon 202, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$.

FIG. 2 illustrates that the source and drain regions 204 for the nanoribbon 202-4 may be labeled as a first source or drain (S/D) region 204-14 and a second S/D region 204-24. For example, the S/D region 204-14 may be a source region while the S/D region 204-24 may be a drain region. In the following, some descriptions may refer to a particular source or drain (S/D) region or contact being either a source region/contact or a drain region/contact. However, unless specified otherwise, which region/contact of a transistor is considered to be a source region/contact and which region/contact is considered to be a drain region/contact is not important because, as is common in the field of field of MOSFETs, designations of source and drain are often interchangeable. Therefore, descriptions of some illustrative embodiments of the source and drain regions/contacts provided herein are applicable to embodiments where the designation of source and drain regions/contacts may be reversed. FIG. 2 further illustrates that the gate stack 206 for the nanoribbon 202-4 may be labeled as a gate stack 206-4. The transistor 210, the S/D regions 204, and the gate stack 206 are not specifically labeled for the other nanoribbons shown in FIG. 2 in order to not clutter the drawing, but their numbering could take the same format as for the nanoribbon 204-4: e.g., the transistor 210 in the nanoribbon 202-3 would be labeled as a transistor 210-3 and would include the S/D regions 204 labeled as a first S/D region 204-13 and a second S/D region 204-23 and further include the gate stack 206 labeled as a gate stack 206-3, and so on. Thus, each of the transistors shown in FIG. 2 has a gate stack terminal, a source terminal, and a drain terminal, indicated in the example of FIG. 2 (only for the nanoribbon 202-4) as terminals G, S, and D, respectively. In the following, the terms "terminal" and "electrode" may be used interchangeably. Furthermore, for S/D terminals, the terms "terminal" and "region" may be used interchangeably.

The gate stack 206 may include a gate electrode material and, optionally, a gate dielectric material. The gate stack 206 may wrap entirely or almost entirely around a portion of the nanoribbon 202, with the active region of the channel material of the nanoribbon 202 corresponding to the portion of the nanoribbon 202 wrapped by the gate stack 206. In particular, the gate dielectric material of the gate stack 206 may wrap around a transversal portion of the nanoribbon 202 and the gate electrode material of the gate stack 206 may wrap around the gate dielectric material. In some embodiments, the gate stack 206 may fully encircle the nanoribbon 202.

The gate electrode material of the gate stack 206 may include at least one P-type work function metal or N-type work function metal, depending on whether the transistor 210 is a PMOS transistor or an NMOS transistor (P-type work function metal used as the gate electrode material of the gate stack 206 when the transistor 210 is a PMOS transistor and N-type work function metal used as the gate electrode material of the gate stack 206 when the transistor 210 is an NMOS transistor). For a PMOS transistor 210, metals that may be used for the gate electrode material may include, but are not limited to, ruthenium, palladium, platinum, cobalt, nickel, and conductive metal oxides (e.g., ruthenium oxide). For an NMOS transistor 210, metals that may be used for the gate electrode material include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material of the gate stack 206 may include a stack of two or more metal layers, where one or more metal layers are work function metal layers and at least one metal layer is a fill metal layer. Further layers may be included next to the gate electrode material for other purposes, such as to act as a diffusion barrier layer or/and an adhesion layer.

In some embodiments, the gate dielectric material of the gate stack 206 may include one or more high-k dielectrics including any of the materials discussed herein with reference to the insulator material that may surround portions of the transistor 210. In some embodiments, an annealing process may be carried out on the gate dielectric material of the gate stack 206 during manufacture of the transistor 210 to improve the quality of the gate dielectric material. The gate dielectric material may have a thickness that may, in some embodiments, be between about 0.5 nanometers and 3 nanometers, including all values and ranges therein (e.g., between about 1 and 3 nanometers, or between about 1 and 2 nanometers). In some embodiments, the gate stack 206 may be surrounded by a gate spacer, not shown in FIG. 2. Such a gate spacer could be configured to provide separation between the gate stack 206 and source/drain contacts of the transistor 210 and could be made of a low-k dielectric material, some examples of which have been provided above. A gate spacer may include pores or air gaps to further reduce its dielectric constant.

As further shown in FIG. 2, the nanoribbon 202 may include a source region 204-1 and a drain region 204-2 on either side of the gate stack 206, thus realizing a transistor. As is well known in the art, source and drain regions are formed for the gate stack of each FET. The S/D regions 204 of the transistor 210 may generally be formed using either an implantation/diffusion process or an etching/deposition process. In the former process, dopants such as boron, aluminum, antimony, phosphorous, or arsenic may be ion-implanted into the nanoribbon 202 to form the source and drain regions 204. An annealing process that activates the dopants and causes them to diffuse further into the nanoribbon 202 may follow the ion implantation process. In the latter process, portions of the nanoribbon 202 may first be etched to form recesses at the locations of the future S/D regions 204. An epitaxial deposition process may then be carried out to fill the recesses with material that is used to fabricate the S/D regions 204. In some implementations, the S/D regions 204 may be fabricated using a silicon alloy such as silicon germanium or silicon carbide. In some implementations the epitaxially deposited silicon alloy may be doped in situ with dopants such as boron, arsenic, or phosphorous. In further embodiments, the S/D regions 204 may be formed using one or more alternate semiconductor materials such as germanium or a group III-V material or alloy. And in further embodiments, one or more layers of metal and/or metal alloys may be used to form the S/D regions 204.

In some embodiments, the transistor 210 may have a gate length (i.e., a distance between the first and second S/D regions 204), a dimension measured along the nanoribbon 202, between about 5 and 40 nanometers, including all values and ranges therein (e.g., between about 22 and 35 nanometers, or between about 20 and 30 nanometers). In some embodiments, an area of a transversal cross-section of the nanoribbon 202 may be between about 25 and 10000 square nanometers, including all values and ranges therein (e.g., between about 25 and 1000 square nanometers, or between about 25 and 500 square nanometers).

What is special about the illustration of the IC device 200 is that the gates of the transistors 210 in different nanoribbons 202 are individually controlled, as is shown with FIG. 2 with individual gate stacks 206 on each of the nanoribbons 202. Thus, the gate stacks 206 of the transistors 210 in different nanoribbons 202, or electrical contacts to these gate stacks, may be electrically discontinuous from one another. Furthermore, the S/D regions 204 of the transistors 210 in different nanoribbons 202 are not, in general, all together electrically coupled to one another. This is shown in FIG. 2 with contact cuts between, e.g., the S/D region/contact 204-14 and the S/D region 204-13, the S/D region/contact 204-24 and the S/D region 204-23, the S/D region/contact 204-13 and the S/D region 204-12, and so on. Separate gate control in the vertical stack 190, and separate S/D contacts enable greater control of the 3D layout.

FIG. 3 provides a schematic illustration of a 3D nanoribbon-based IC device 300 with interconnects between nanoribbons in a vertical stack of nanoribbons, according to some embodiments of the present disclosure. The IC device 300 may be one example of the IC device 100, shown in FIG. 1, although not all details of the IC device 100 are specifically shown in FIG. 3, but, rather, only an example implementation of the vertical stack 190. Therefore, all of the descriptions provided with respect to the IC device 100 are applicable to the IC device 300 and, in the interests of brevity, are not repeated. Furthermore, the IC device 300 illustrates some elements with the same reference numerals as those shown in FIG. 2 to illustrate the same or analogous components. Therefore, descriptions of these components provided with respect to the IC device 200 are applicable to the IC device 300 and, in the interests of brevity, are not repeated. What is specifically shown for the IC device 300 is the second feature that enables improved 3D nanoribbon-based logic devices—namely, the inter-ribbon interconnects in the vertical stack 190, schematically illustrated in FIG. 3 as inter-ribbon interconnects 320-1, 320-2, and 320-3. In some embodiments, only some of the inter-ribbon interconnects 320 shown in FIG. 3 may be present, and the other ones being absent. In general, the inter-ribbon interconnects 320 are configured to provide electrical connectivity between selected S/D terminals 204 and/or gates 206 of the transistors 210 in different nanoribbons 202 of the vertical stack 190. Such selective electrical connectivity enables flexibility in the design of the 3D nanoribbon-based logic circuits described herein. Each of inter-ribbon interconnects 320, as well as various contacts to transistor terminals and other interconnects described herein, may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

FIG. 4 provides a schematic illustration of a 3D nanoribbon-based IC device 400 with both P- and N-type nanoribbons in a vertical stack of nanoribbons, according to some embodiments of the present disclosure. The IC device 400 may be one example of the IC device 100, shown in FIG. 1, although not all details of the IC device 100 are specifically shown in FIG. 4, but, rather, only an example implementation of the vertical stack 190. Therefore, all of the descriptions provided with respect to the IC device 100 are applicable to the IC device 400 and, in the interests of brevity, are not repeated. Furthermore, the IC device 400 illustrates some elements with the same reference numerals as those shown in FIG. 2 to illustrate the same or analogous components. Therefore, descriptions of these components provided with respect to the IC device 200 are applicable to the IC device 400 and, in the interests of brevity, are not repeated. What is specifically shown for the IC device 400 is the third feature that enables improved 3D nanoribbon-based logic devices—namely, that some of the nanoribbons in the vertical stack 190 may be implemented as N-type nanoribbons (i.e., as nanoribbons formed of one or more N-type semiconductor materials), while other nanoribbons in the vertical stack 190 may be implemented as P-type nanoribbons (i.e., as nanoribbons formed of one or more P-type semiconductor materials). This is schematically illustrated in FIG. 4 with one pattern used for the nanoribbons 202-1, 202-2, and another pattern used for the nanoribbons 202-3, 202-4. The different patterns indicate different dopant type of the semiconductor materials of the nanoribbons. For example, the nanoribbons 202-1, 202-2 may be N-type nanoribbons, while the nanoribbons 202-3, 202-4 may be P-type nanoribbons. In other embodiments of the IC device 400, the division between which of the nanoribbons 202 are N-type and which of the nanoribbons 202 are P-type may be different from what is shown in FIG. 4. The transistors 210 implemented in N-type nanoribbons 202 would be NMOS transistors, while the transistors 210 implemented in P-type nanoribbons 202 would be PMOS transistors, thus advantageously enabling various CMOS architectures. Discussions with respect to the differences in semiconductor materials of the nanoribbons 202 used to implement NMOS and PMOS transistors, as well as differences in gate electrode materials used for NMOS and PMOS transistors are provided above and, in the interests of brevity, are not repeated here.

Examples of 3D Nanoribbon-Based Logic

By implementing one or more of independent gate control as shown in FIG. 2, inter-ribbon interconnects as shown in FIG. 3, and a combination of P- and N-type nanoribbons as shown in FIG. 4, for at least for some of the transistors 210 in at least some portions of the vertical stack of nanoribbons 202, various 3D nanoribbon-based logic devices with improved metrics may be realized. Some examples of such devices are shown in FIGS. 5-9.

Figure 5A:
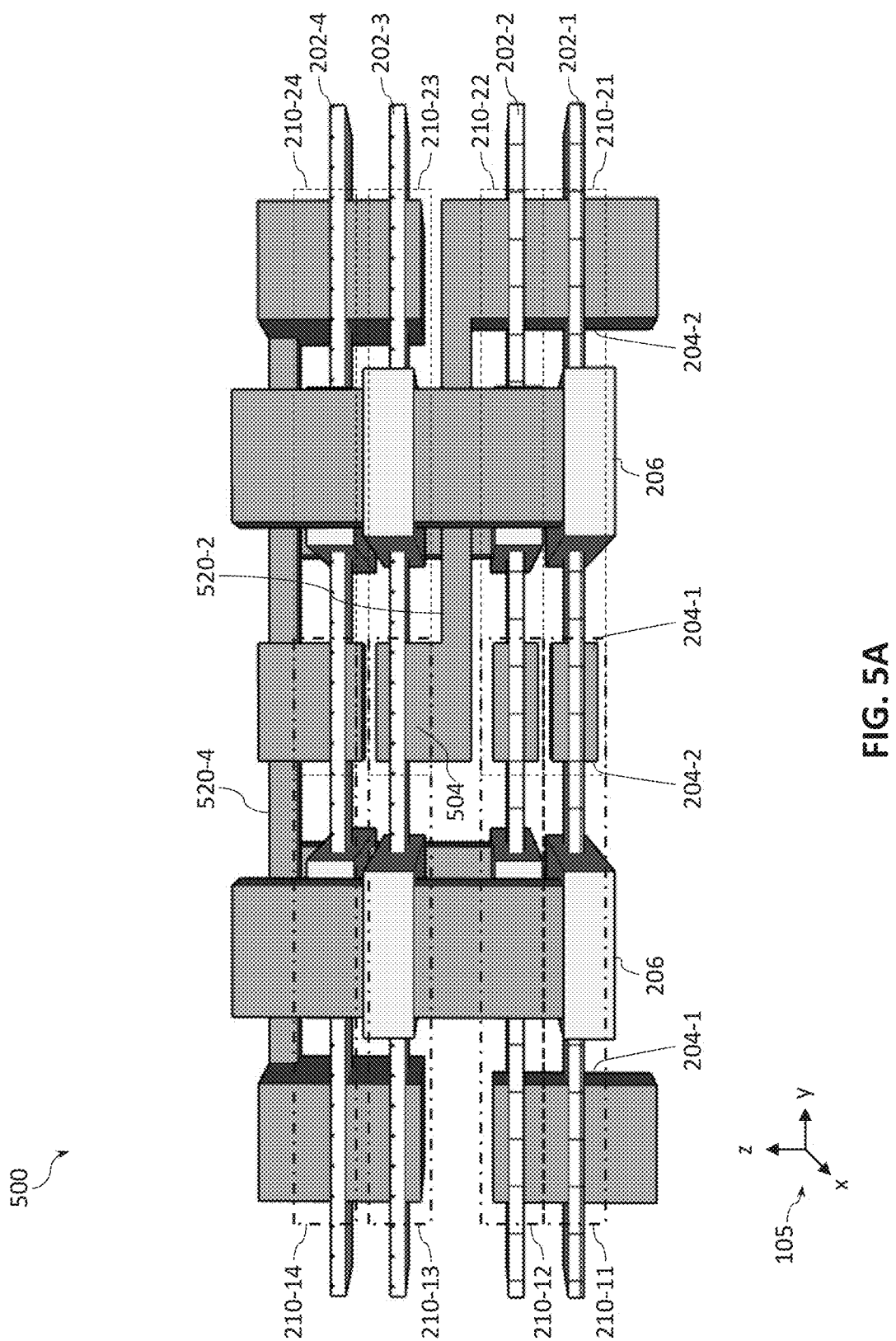
FIGS. 5A and 5B provide different perspective views of a 3D nanoribbon-based IC device implementing an example AND-OR-Invert (AOI) logic, according to some embodiments of the present disclosure.
Figure 5B:
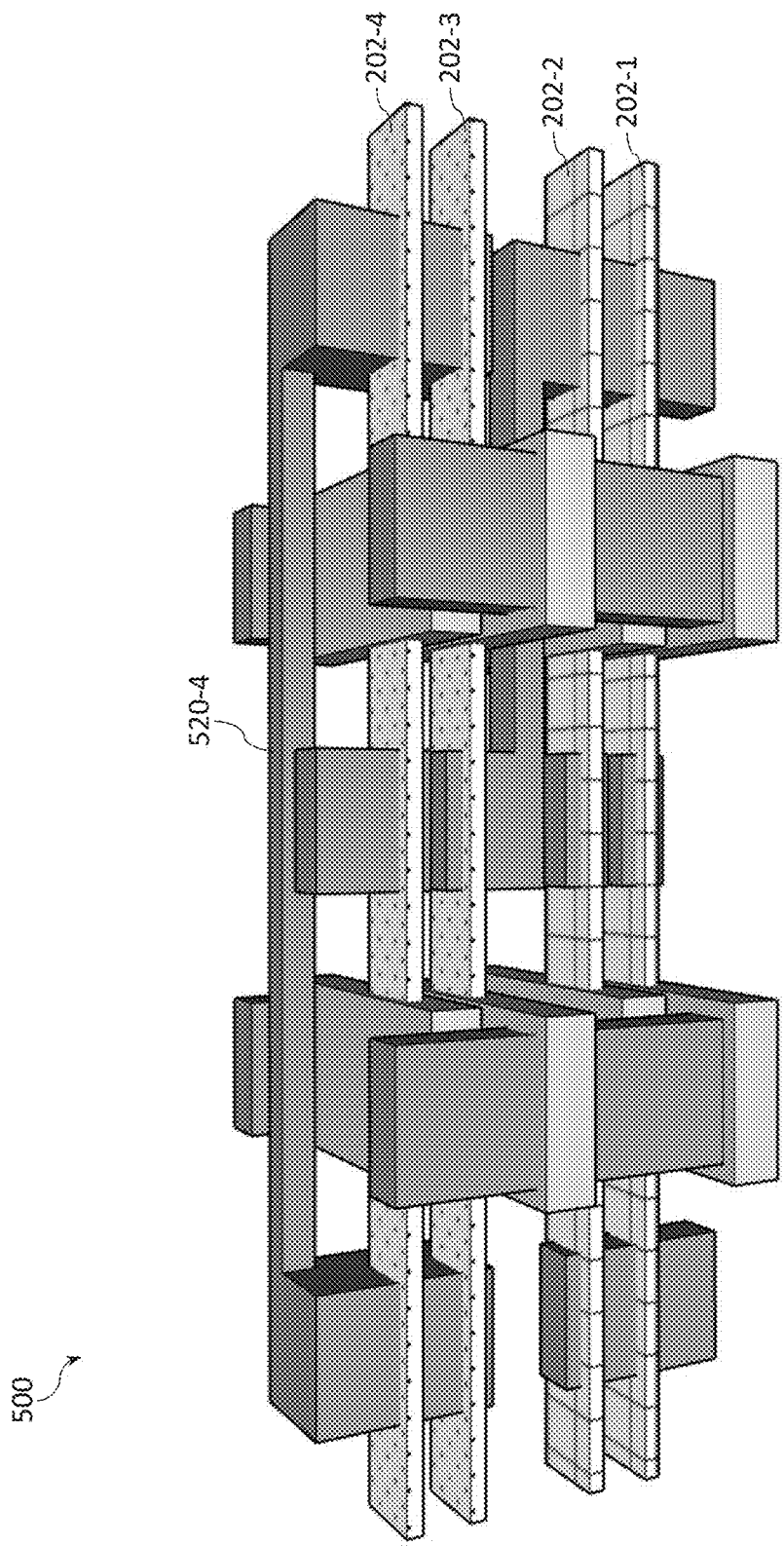
Figure 5C:
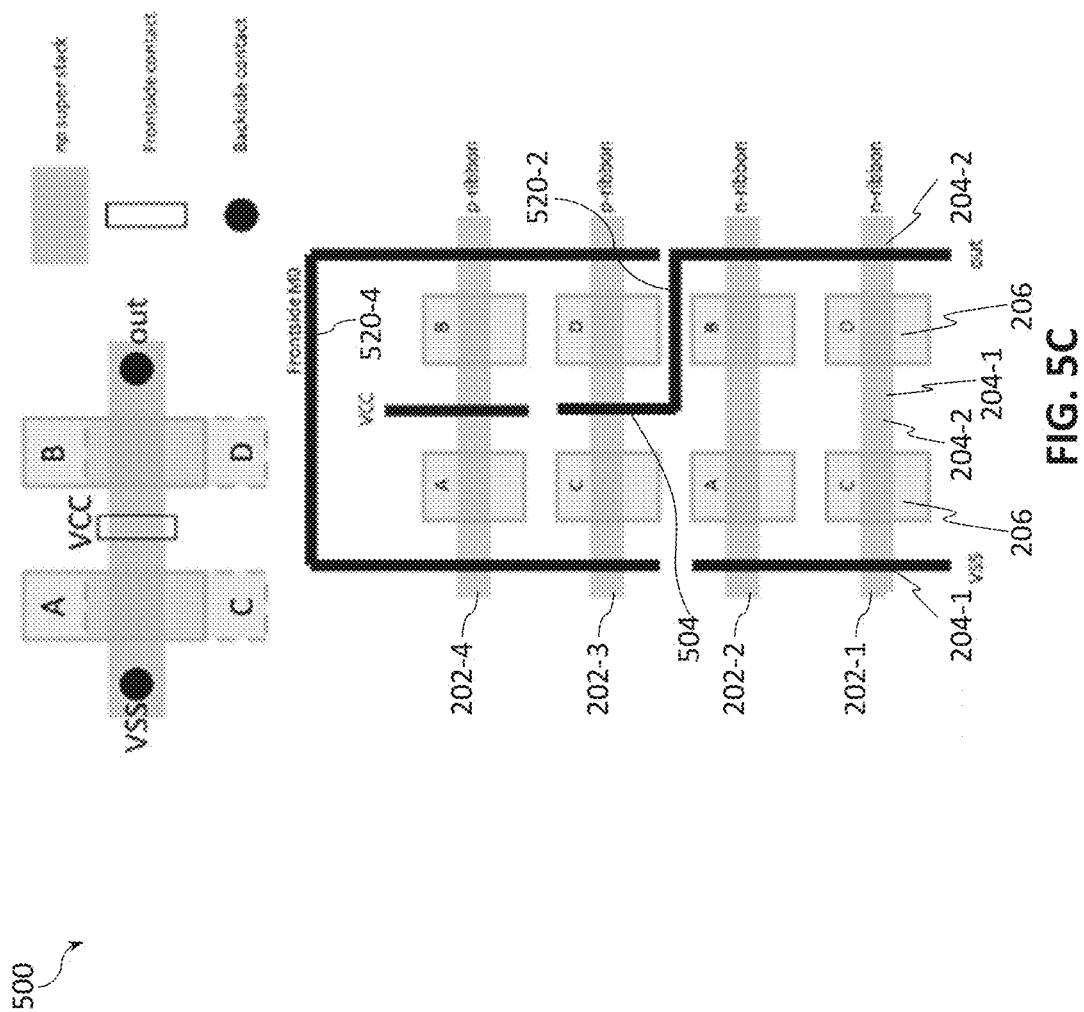
FIG. 5C provides top-down and cross-sectional views of the 3D nanoribbon-based IC device implementing an example AOI logic as shown in FIGS. 5A and 5B, according to some embodiments of the present disclosure.

FIG. 5 provides different views of a 3D nanoribbon-based IC device 500 implementing an example AOI logic, according to some embodiments of the present disclosure. In particular, FIGS. 5A and 5B provide different perspective views (not one but two different perspective views are shown in an attempt to bring clarity of the arrangement of the device 500), while FIG. 5C provides top-down and cross-sectional views (provided, respectively, at the top and the bottom of the page of the drawing) of the IC device 500. The IC device 500 is an example of the IC device 100 which implements various features shown in FIGS. 2-4. To that end, the IC device 500 uses the same reference numerals as those used in FIGS. 2-4 to illustrate similar or analogous elements, so that their descriptions provided with respect to FIGS. 2-4 are not repeated here and are applicable to the IC device 500, as will be explained below. In particular, the IC device 500 illustrates an example where four nanoribbons 202 are shown (similar to FIGS. 2-4) and where two transistors 210 are shown in each of the nanoribbons 202. Each of the nanoribbons 202 of the IC device 500 may be considered to belong to a different one of the nanoribbon layers 130, 140, etc., shown in FIG. 1.

It should be noted that not all elements shown in each of FIGS. 5A-5C are labeled with reference numerals in order to not clutter the drawings. For example, while each of FIGS. 5A-5C illustrates the four vertically stacked nanoribbons 202-1 through 202-4, only FIG. 5A provides labels for the 8 transistors 210 shown in the IC device 500 (the 8 transistors labeled in FIG. 5A as transistors 210-11 and 210-21 provided in the nanoribbon 202-1, transistors 210-12 and 210-22 provided in the nanoribbon 202-2, transistors 210-13 and 210-23 provided in the nanoribbon 202-3, and transistors 210-14 and 210-24 provided in the nanoribbon 202-4). The cross-sectional view of FIG. 5C does provide labels for the four vertically stacked nanoribbons 202-1 through 202-4 but indicates the individual transistors 210 with letters A, B, C, and D. More specifically, the cross-sectional view of FIG. 5C refers to the transistors in the N-type nanoribbons 202-2 and 202-1 included in the IC device 500, i.e., the transistors 210-12, 210-22, 210-11, and 210-21 as, respectively, transistors A, B, C, and D, and also refers to the transistors in the P-type nanoribbons 202-4 and 202-3 included in the IC device 500, i.e., the transistors 210-14, 210-24, 210-13, and 210-23 as, respectively, transistors A, B, C, and D. The top-down view of FIG. 5C illustrates how the transistors A may be stacked over the transistors C and, similarly, transistors B may be stacked over transistors D.

Now, various connections shown in FIG. 5 will be described, but it should be noted that other connections not specifically described but shown in FIG. 5 are within the scope of the present disclosure. The nanoribbons 202-1 and 202-2 are N-type nanoribbons, while the nanoribbons 202-3 and 202-4 are P-type nanoribbons, which is example implementation of the third feature described herein (the feature explained with reference to FIG. 4). Each of the transistors 210 includes a first S/D region 204-1, a second S/D region 204-2, and a gate stack 206 in between the first and second S/D regions 204 (labels for the elements are only provided for the bottom 2 transistors shown in FIG. 5A, in order to not clutter the drawings, but the other transistors use the same notation for the S/D regions and the gate stack). Each of the transistors 210 may have an individually controllable gate 206, which is example implementation of the first feature described herein (the feature explained with reference to FIG. 2). When the nanoribbons 202 extend in a direction substantially parallel to the support structure 110, the gate contacts may be arranged in a staircase-like manner to enable easy and compact individual gate control. In some embodiments, gates 206 of the transistors 210-13 and 210-11 may be coupled together and gates 206 of the transistors 210-14 and 210-12 may be coupled together. Similarly, in some embodiments, gates 206 of the transistors 210-23 and 210-21 may be coupled together and gates 206 of the transistors 210-24 and 210-22 may be coupled together. The second S/D region 204-2 of the transistor 210-11 may be shared or electrically coupled to the first S/D region 204-1 of the transistor 210-21, the second S/D region 204-2 of the transistor 210-12 may be shared or electrically coupled to the first S/D region 204-1 of the transistor 210-22, the second S/D region 204-2 of the transistor 210-13 may be shared or electrically coupled to the first S/D region 204-1 of the transistor 210-23, and the second S/D region 204-2 of the transistor 210-14 may be shared or electrically coupled to the first S/D region 204-1 of the transistor 210-24. The first S/D region 204-1 of the transistor 210-13 may be coupled to the first S/D region 204-1 of the transistor 210-14, forming a first coupled pair of S/D regions of transistors from different nanoribbons. The second S/D region 204-2 of the transistor 210-23 may be coupled to the second S/D region 204-2 of the transistor 210-24, forming a second coupled pair of S/D regions of transistors from different nanoribbons. These two pairs may be coupled to one another using an inter-ribbon interconnect 520-4, which is example implementation of the second feature described herein (the feature explained with reference to FIG. 3). Similarly, the first S/D region 204-1 of the transistor 210-11 may be coupled to the first S/D region 204-1 of the transistor 210-12, forming a third coupled pair of S/D regions of transistors from different nanoribbons. The second S/D region 204-2 of the transistor 210-21 may be coupled to the second S/D region 204-2 of the transistor 210-22, forming a fourth coupled pair of S/D regions of transistors from different nanoribbons. The fourth pair may be coupled to the shared S/D region (labeled in FIG. 5 as a region 504) between the transistor 210-13 and the transistor 210-23 using an inter-ribbon interconnect 520-2, which is another example implementation of the second feature described herein (the feature explained with reference to FIG. 3). As shown in FIG. 5C, in some embodiments, the inter-ribbon interconnect 520-2 may include an elongated portion of an electrically conductive material having a long axis in a plane between a plane of the nanoribbon 202-2 and a plane of the nanoribbon 202-3. The elongated portion of the inter-ribbon interconnect 520-2 may include a first end and a second end, where the first end is electrically coupled to the second S/D region of the transistor 210-22 from a top side of the nanoribbon 202-2, and the second end is electrically coupled to the first S/D region of the transistor 210-23 from a bottom side of the nanoribbon 202-3. FIG. 5C further illustrates how various S/D regions are connected to VSS, VCC, and output node ("out") of the IC device 500.

Figure 6:
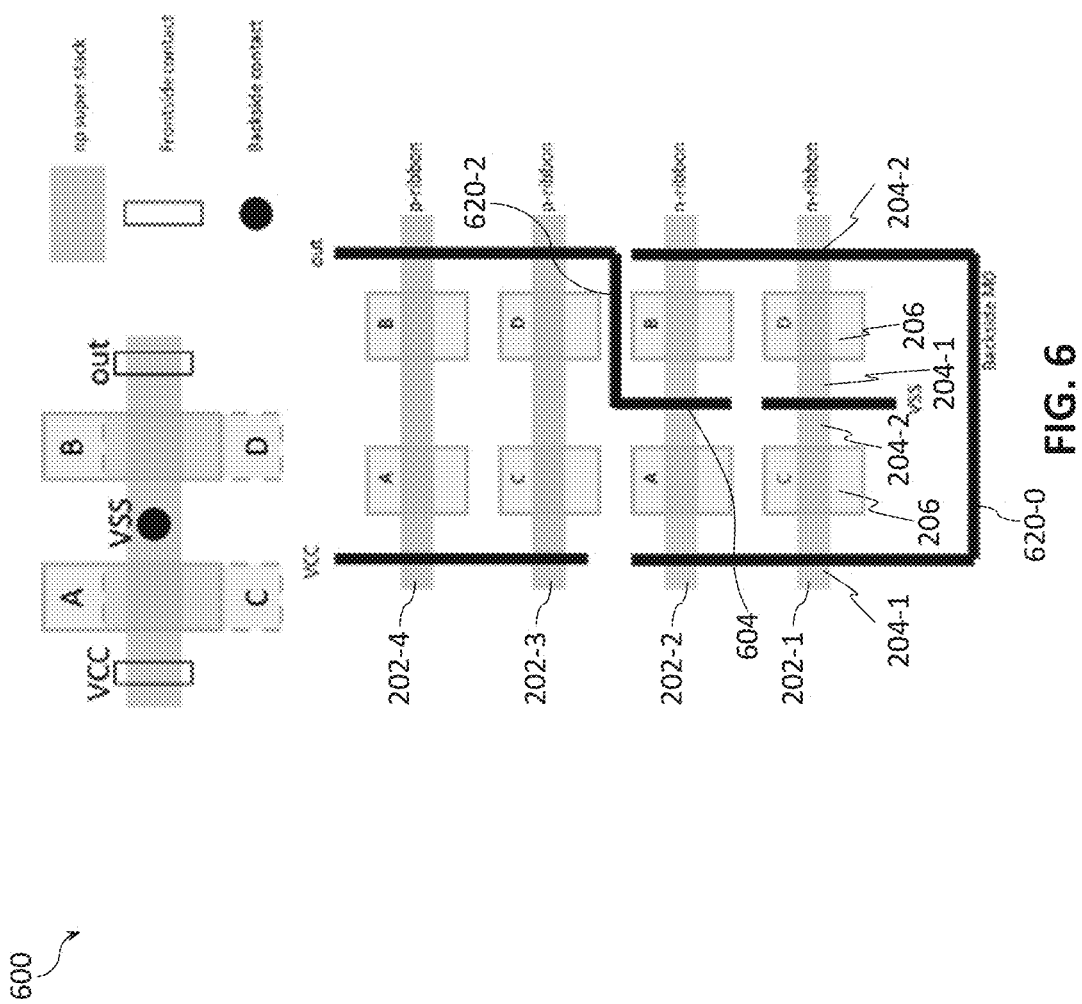
FIG. 6 provides top-down and cross-sectional views of a 3D nanoribbon-based IC device implementing an example OR-AND-Invert (OAI) logic, according to some embodiments of the present disclosure.

FIG. 6 provides different views of a 3D nanoribbon-based IC device 600 implementing an example OAI logic, according to some embodiments of the present disclosure. In particular, FIG. 6 provides top-down and cross-sectional views (provided, respectively, at the top and the bottom of the page of the drawing) of the IC device 600, similar to the illustration of FIG. 5C. The IC device 600 is an example of the IC device 100 which implements various features shown in FIGS. 2-4. To that end, the IC device 600 uses the same reference numerals as those used in FIGS. 2-4 to illustrate similar or analogous elements, so that their descriptions provided with respect to FIGS. 2-4 are not repeated here and are applicable to the IC device 600, as will be explained below. In particular, the IC device 600 illustrates an example where four nanoribbons 202 are shown (similar to FIGS. 2-4) and where two transistors 210 are provided along each of the nanoribbons 202. Each of the nanoribbons 202 of the IC device 600 may be considered to belong to a different one of the nanoribbon layers 130, 140, etc., shown in FIG. 1. Similar to FIG. 5C, the cross-sectional view of FIG. 6 provides labels for the four vertically stacked nanoribbons 202-1 through 202-4 but indicates the individual transistors 210 with letters A, B, C, and D. More specifically, the cross-sectional view of FIG. 6 refers to the transistors in the N-type nanoribbons 202-2 and 202-1 included in the IC device 600, i.e., the transistors 210-12, 210-22, 210-11, and 210-21 arranged as in FIG. 5 as, respectively, transistors A, B, C, and D, and also refers to the transistors in the P-type nanoribbons 202-4 and 202-3 included in the IC device 600, i.e., the transistors 210-14, 210-24, 210-13, and 210-23 arranged as in FIG. 5 as, respectively, transistors A, B, C, and D. Also similar to FIG. 5C, the top-down view of FIG. 6 illustrates how the transistors A may be stacked over the transistors C and, similarly, transistors B may be stacked over transistors D.

The IC device 600 is substantially similar to the IC device 500 and, therefore, descriptions provided with respect to the IC device 500 are not repeated and only the differences are described. One difference is that, instead of using the inter-ribbon interconnect 520-4, an inter-ribbon interconnect 620-0 is used, coupling the third and the fourth coupled pair of S/D regions of transistors from the nanoribbons 202-1 and 202-2. Another difference is that, instead of using the inter-ribbon interconnect 520-2, an inter-ribbon interconnect 620-2 is used, coupling the second pair of S/D regions of the transistors 202-23 and 202-24 from the nanoribbons 202-3 and 202-4 with the shared S/D region (labeled in FIG. 6 as a region 604) between the transistor 210-12 and the transistor 210-22. FIG. 6 further illustrates how various S/D regions are connected to VSS, VCC, and output node ("out") of the IC device 500.

FIG. 7 provides different views of a 3D nanoribbon-based IC device 700 implementing an example NAND logic, according to some embodiments of the present disclosure. In particular, FIG. 7 provides top-down and cross-sectional views (provided, respectively, at the top and the bottom of the page of the drawing) of the IC device 700, similar to the illustration of FIG. 5C. The IC device 700 is an example of the IC device 100 which implements various features shown in FIGS. 2-4. To that end, the IC device 700 uses the same reference numerals as those used in FIGS. 2-4 to illustrate similar or analogous elements, so that their descriptions provided with respect to FIGS. 2-4 are not repeated here and are applicable to the IC device 700, as will be explained below. In particular, the IC device 700 illustrates an example where four nanoribbons 202 are shown (similar to FIGS. 2-4), where one transistor 210 is shown in each of the nanoribbons 202. Each of the nanoribbons 202 of the IC device 700 may be considered to belong to a different one of the nanoribbon layers 130, 140, etc., shown in FIG. 1. Similar to FIG. 5C, the cross-sectional view of FIG. 7 provides labels for the four vertically stacked nanoribbons 202-1 through 202-4 but indicates the individual transistors 210 with letters A, B, C, and D. More specifically, the cross-sectional view of FIG. 7 refers to the transistors in the N-type nanoribbons 202-2 and 202-1 included in the IC device 700 as, respectively, transistors A and B, and also refers to the transistors in the P-type nanoribbons 202-4 and 202-3 included in the IC device 700 as, respectively, transistors A and B. Also similar to FIG. 5C, the top-down view of FIG. 7 illustrates how the transistors A may be stacked over the transistors B.

Now, various connections shown in FIG. 7 will be described, but it should be noted that other connections not specifically described but shown in FIG. 7 are within the scope of the present disclosure. The nanoribbons 202-1 and 202-2 are N-type nanoribbons, while the nanoribbons 202-3 and 202-4 are P-type nanoribbons, which is example implementation of the third feature described herein (the feature explained with reference to FIG. 4). Each of the transistors A, B shown in FIG. 7 includes a first S/D region 204-1, a second S/D region 204-2, and a gate stack 206 in between the first and second S/D regions 204 (labels for the elements are only provided for the bottom transistor shown in FIG. 7, in order to not clutter the drawing, but the other transistors use the same notation for the S/D regions and the gate stack). Each of the transistors A, B shown in FIG. 7 may have an individually controllable gate 206, which is example implementation of the first feature described herein (the feature explained with reference to FIG. 2). When the nanoribbons 202 extend in a direction substantially parallel to the support structure 110, the gate contacts may be arranged in a staircase-like manner to enable easy and compact individual gate control. The first S/D region 204-1 of the transistor B in the nanoribbon 202-1 may be coupled to the first S/D region 204-1 of the transistor A in the nanoribbon 202-2. Similarly, the first S/D region 204-1 of the transistor B in the nanoribbon 202-3 may be coupled to the first S/D region 204-1 of the transistor A in the nanoribbon 202-4. The second S/D regions 204-2 of the transistors A and B in the nanoribbons 202-4, 202-3, and of the transistor A in the nanoribbon 202-2 may also be coupled together, and together coupled to the output terminal ("out"). The second S/D regions 204-2 of the transistor B in the nanoribbon 202-1 may be coupled to VSS. FIG. 7 further illustrates how various S/D regions are connected to VSS, VCC, and output node ("out") of the IC device 700.

FIG. 8 provides different views of a 3D nanoribbon-based IC device 800 implementing an example NOR logic, according to some embodiments of the present disclosure. In particular, FIG. 8 provides top-down and cross-sectional views (provided, respectively, at the top and the bottom of the page of the drawing) of the IC device 800, similar to the illustration of FIG. 5C. The IC device 800 is an example of the IC device 100 which implements various features shown in FIGS. 2-4. To that end, the IC device 800 uses the same reference numerals as those used in FIGS. 2-4 to illustrate similar or analogous elements, so that their descriptions provided with respect to FIGS. 2-4 are not repeated here and are applicable to the IC device 800, as will be explained below. In particular, the IC device 800 illustrates an example where four nanoribbons 202 are shown (similar to FIGS. 2-4), where one transistor 210 is shown in each of the nanoribbons 202. Each of the nanoribbons 202 of the IC device 800 may be considered to belong to a different one of the nanoribbon layers 130, 140, etc., shown in FIG. 1. Similar to FIG. 5C, the cross-sectional view of FIG. 8 provides labels for the four vertically stacked nanoribbons 202-1 through 202-4 but indicates the individual transistors 210 with letters A, B, C, and D. More specifically, the cross-sectional view of FIG. 8 refers to the transistors in the N-type nanoribbons 202-2 and 202-1 included in the IC device 800 as, respectively, transistors A and B, and also refers to the transistors in the P-type nanoribbons 202-4 and 202-3 included in the IC device 800 as, respectively, transistors A and B. Also similar to FIG. 5C, the top-down view of FIG. 8 illustrates how the transistors A may be stacked over the transistors B.

Now, various connections shown in FIG. 8 will be described, but it should be noted that other connections not specifically described but shown in FIG. 8 are within the scope of the present disclosure. The nanoribbons 202-1 and 202-2 are N-type nanoribbons, while the nanoribbons 202-3 and 202-4 are P-type nanoribbons, which is example implementation of the third feature described herein (the feature explained with reference to FIG. 4). Each of the transistors A, B shown in FIG. 8 includes a first S/D region 204-1, a second S/D region 204-2, and a gate stack 206 in between the first and second S/D regions 204 (labels for the elements are only provided for the bottom transistor shown in FIG. 8, in order to not clutter the drawing, but the other transistors use the same notation for the S/D regions and the gate stack). Each of the transistors A, B shown in FIG. 8 may have an individually controllable gate 206, which is example implementation of the first feature described herein (the feature explained with reference to FIG. 2). When the nanoribbons 202 extend in a direction substantially parallel to the support structure 110, the gate contacts may be arranged in a staircase-like manner to enable easy and compact individual gate control. The first S/D region 204-1 of the transistor B in the nanoribbon 202-1 may be coupled to the first S/D region 204-1 of the transistor A in the nanoribbon 202-2. Similarly, the first S/D region 204-1 of the transistor B in the nanoribbon 202-3 may be coupled to the first S/D region 204-1 of the transistor A in the nanoribbon 202-4. The second S/D regions 204-2 of the transistors A and B in the nanoribbons 202-2, 202-1, and of the transistor B in the nanoribbon 202-3 may also be coupled together, and together coupled to the output terminal ("out"). The second S/D regions 204-2 of the transistor A in the nanoribbon 202-4 may be coupled to VCC. FIG. 8 further illustrates how various S/D regions are connected to VSS, VCC, and output node ("out") of the IC device 800.

FIG. 9 provides different views of a 3D nanoribbon-based IC device 900 implementing an example INV logic, according to some embodiments of the present disclosure. In particular, FIG. 9 provides top-down and cross-sectional views (provided, respectively, at the top and the bottom of the page of the drawing) of the IC device 900, similar to the illustration of FIG. 5C. The IC device 900 is an example of the IC device 100 which implements various features shown in FIGS. 2-4. To that end, the IC device 900 uses the same reference numerals as those used in FIGS. 2-4 to illustrate similar or analogous elements, so that their descriptions provided with respect to FIGS. 2-4 are not repeated here and are applicable to the IC device 900, as will be explained below. In particular, the IC device 900 illustrates an example where four nanoribbons 202 are shown (similar to FIGS. 2-4), where one transistor 210 is shown in each of the nanoribbons 202. Each of the nanoribbons 202 of the IC device 900 may be considered to belong to a different one of the nanoribbon layers 130, 140, etc., shown in FIG. 1. Similar to FIG. 5C, the cross-sectional view of FIG. 9 provides labels for the four vertically stacked nanoribbons 202-1 through 202-4.

Now, various connections shown in FIG. 9 will be described, but it should be noted that other connections not specifically described but shown in FIG. 9 are within the scope of the present disclosure. The nanoribbons 202-1 and 202-2 are N-type nanoribbons, while the nanoribbons 202-3 and 202-4 are P-type nanoribbons, which is example implementation of the third feature described herein (the feature explained with reference to FIG. 4). Each of the transistors shown in FIG. 9 includes a first S/D region 204-1, a second S/D region 204-2, and a gate stack 206 in between the first and second S/D regions 204 (labels for the elements are only provided for the bottom transistor shown in FIG. 9, in order to not clutter the drawing, but the other transistors use the same notation for the S/D regions and the gate stack). In some embodiments, the transistors in different nanoribbons 202-1 through 202-4 may have gates which are electrically coupled to one another, as is shown in FIG. 9 with a letter A (designating, in this drawing, the common gate of the transistors shown). The first S/D region 204-1 of the transistor in the nanoribbon 202-1 may be coupled to the first S/D region 204-1 of the transistor in the nanoribbon 202-2 and together be coupled to VSS. Similarly, the first S/D region 204-1 of the transistor in the nanoribbon 202-3 may be coupled to the first S/D region 204-1 of the transistor in the nanoribbon 202-4 and together be coupled to VCC. The second S/D regions 204-2 of the transistors in each of the nanoribbons 202-1 through 202-4 may be coupled together, and together coupled to the output terminal ("out").

Variations and Implementations

Various device assemblies illustrated in FIGS. 1-9 do not represent an exhaustive set of IC devices with 3D nanoribbon-based logic as described herein, but merely provide examples of such devices/structures/assemblies. Multitude of other logic circuits are possible by implementing 3D nanoribbon-based IC devices with one or more of individual gate control in a vertical stack of nanoribbons, inter-ribbon interconnects in a vertical stack of nanoribbons, and both P- and N-type nanoribbons in a vertical stack of nanoribbons, as described herein, all of which being within the scope of the present disclosure. To name a few, concepts described herein can be extended to create any logic gate, the logic gates can be multiple inputs and/or multiple outputs logic gates, sequential and flops that can hold state, the logic gates can support multi-valued logic, input/output (IO) design, ESD, clamps, level shifters, and the gates can support power delivery, and any voltage regulators.

The number and positions of various elements shown in FIGS. 1-9 is purely illustrative and, in various other embodiments, other numbers of these elements, provided in other locations relative to one another may be used in accordance with the general architecture considerations described herein. For example, in some embodiments, memory cells may be included in any of the IC devices shown in FIGS. 1-9, either in the same or separate metal layers from those in which the logic devices are shown.

Further, FIGS. 1-9 are intended to show relative arrangements of the elements therein, and the device assemblies of these figures may include other elements that are not specifically illustrated (e.g., various interfacial layers). Similarly, although particular arrangements of materials are discussed with reference to FIGS. 1-9, intermediate materials may be included in the IC devices and assemblies of these figures. Still further, although some elements of the various cross-sectional views are illustrated in FIGS. 1-9 as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate semiconductor device assemblies.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of the 3D nanoribbon-based logic devices as described herein.

Example Electronic Devices

Arrangements with one or more 3D nanoribbon-based logic devices as disclosed herein may be included in any suitable electronic device. FIGS. 10-13 illustrate various examples of devices and components that may include one or more 3D nanoribbon-based logic devices as disclosed herein.

Figures 10A, 10B:
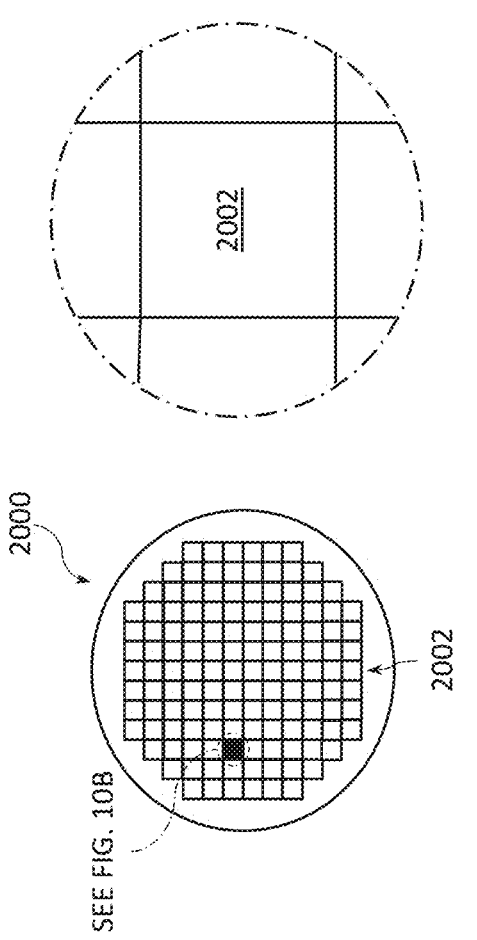
FIGS. 10A and 10B are top views of, respectively, a wafer and dies that may include one or more 3D nanoribbon-based logic devices in accordance with any of the embodiments disclosed herein.

FIGS. 10A-10B are top views of a wafer 2000 and dies 2002 that may include one or more 3D nanoribbon-based logic devices in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 11. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more 3D nanoribbon-based logic devices as described herein). After the fabrication of the semiconductor product is complete (e.g., after manufacture of one or more layers of the nanoribbon-based logic devices as described herein, the wafer 2000 may undergo a singulation process in which each of the dies 2002 is separated from one another to provide discrete "chips" of the semiconductor product. In particular, IC devices that include one or more 3D nanoribbon-based logic devices as disclosed herein may take the form of the wafer 2000 (e.g., not singulated) or the form of the die 2002 (e.g., singulated). The die 2002 may include supporting circuitry to route electrical signals to various transistors, as well as any other IC components. In some embodiments, the wafer 2000 or the die 2002 may implement or include a logic device (e.g., an AND, OR, NAND, or NOR gate, e.g., implemented as one or more ICs that include one or more 3D nanoribbon-based logic devices), a memory device (e.g., a DRAM device), or any other suitable circuit element. Multiple ones of these devices may be combined on a single die 2002. For example, a logic array formed by multiple logic devices as described herein, and, in some embodiments, may be formed on a same die 2002 as a memory (e.g., the memory 2404 of FIG. 13).

Figure 11:
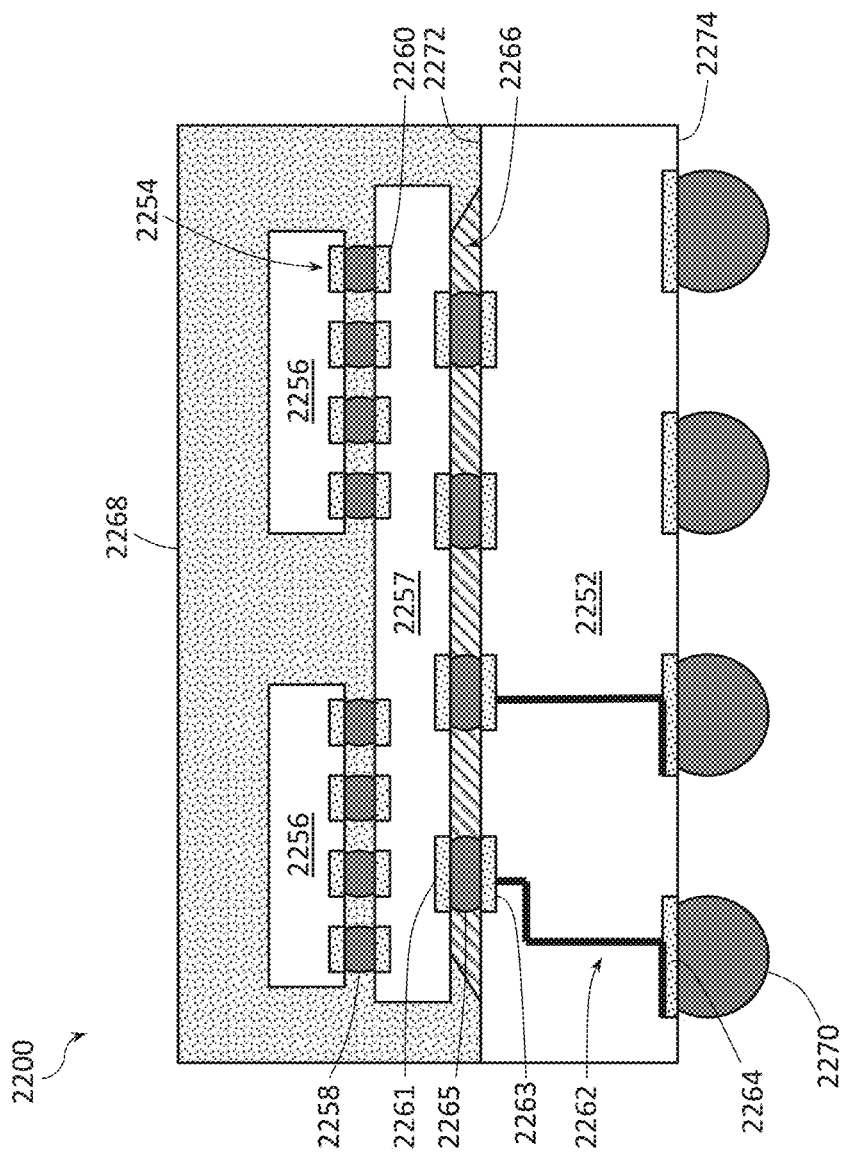
FIG. 11 is a cross-sectional side view of an IC package that may include one or more 3D nanoribbon-based logic devices in accordance with any of the embodiments disclosed herein.

FIG. 11 is a side, cross-sectional view of an example IC package 2200 that may include one or more 3D nanoribbon-based logic devices in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 11 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 11 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 11 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 12.

The dies 2256 may take the form of any of the embodiments of the die 2002 discussed herein (e.g., may include any of the embodiments of the 3D nanoribbon-based logic devices as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded memory dies as described herein. In some embodiments, any of the dies 2256 may include one or more 3D nanoribbon-based logic devices, e.g., as discussed above; in some embodiments, at least some of the dies 2256 may not include any 3D nanoribbon-based logic devices.

The IC package 2200 illustrated in FIG. 11 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 11, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 12:
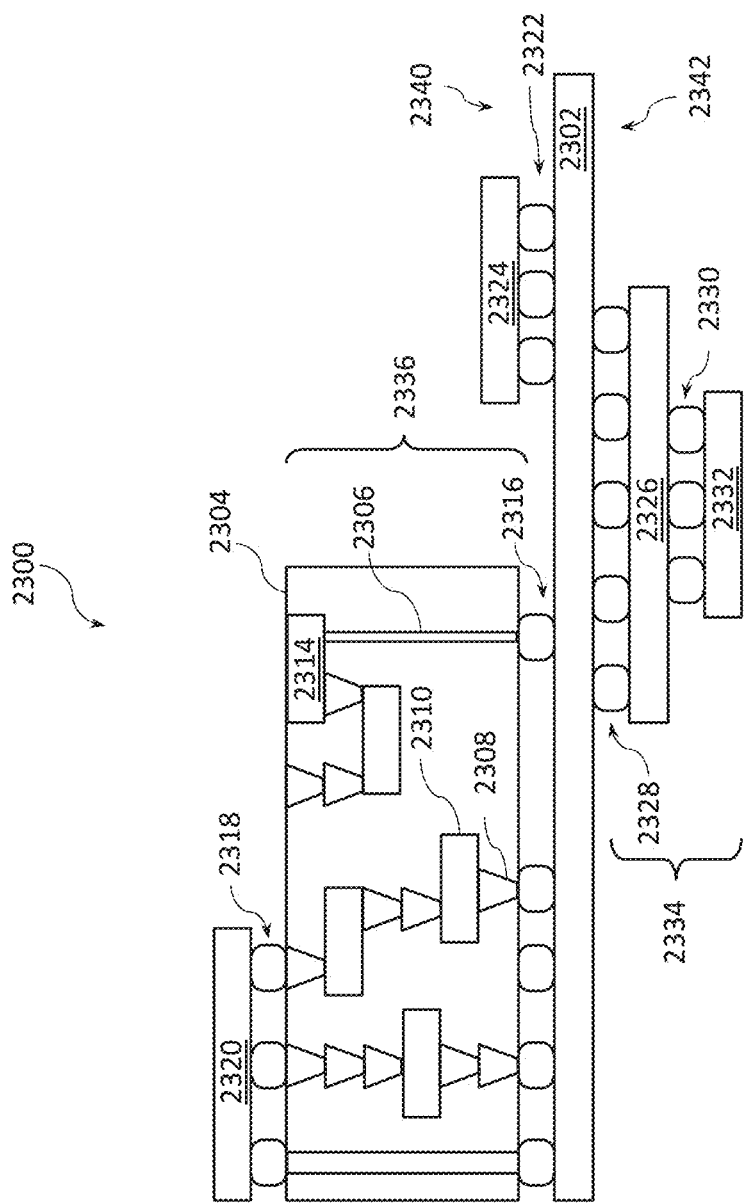
FIG. 12 is a cross-sectional side view of an IC device assembly that may include one or more 3D nanoribbon-based logic devices in accordance with any of the embodiments disclosed herein.

FIG. 12 is a cross-sectional side view of an IC device assembly 2300 that may include components having one or more 3D nanoribbon-based logic devices in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more 3D arrays with nanoribbon-based logic devices in accordance with any of the embodiments disclosed herein; e.g., any of the IC packages discussed below with reference to the IC device assembly 2300 may take the form of any of the embodiments of the IC package 2200 discussed above with reference to FIG. 11 (e.g., may include one or more 3D nanoribbon-based logic devices provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 12 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 12), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 10B), an IC device, or any other suitable component. In particular, the IC package 2320 may include one or more 3D nanoribbon-based logic devices as described herein. Although a single IC package 2320 is shown in FIG. 12, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 12, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 12 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 13:
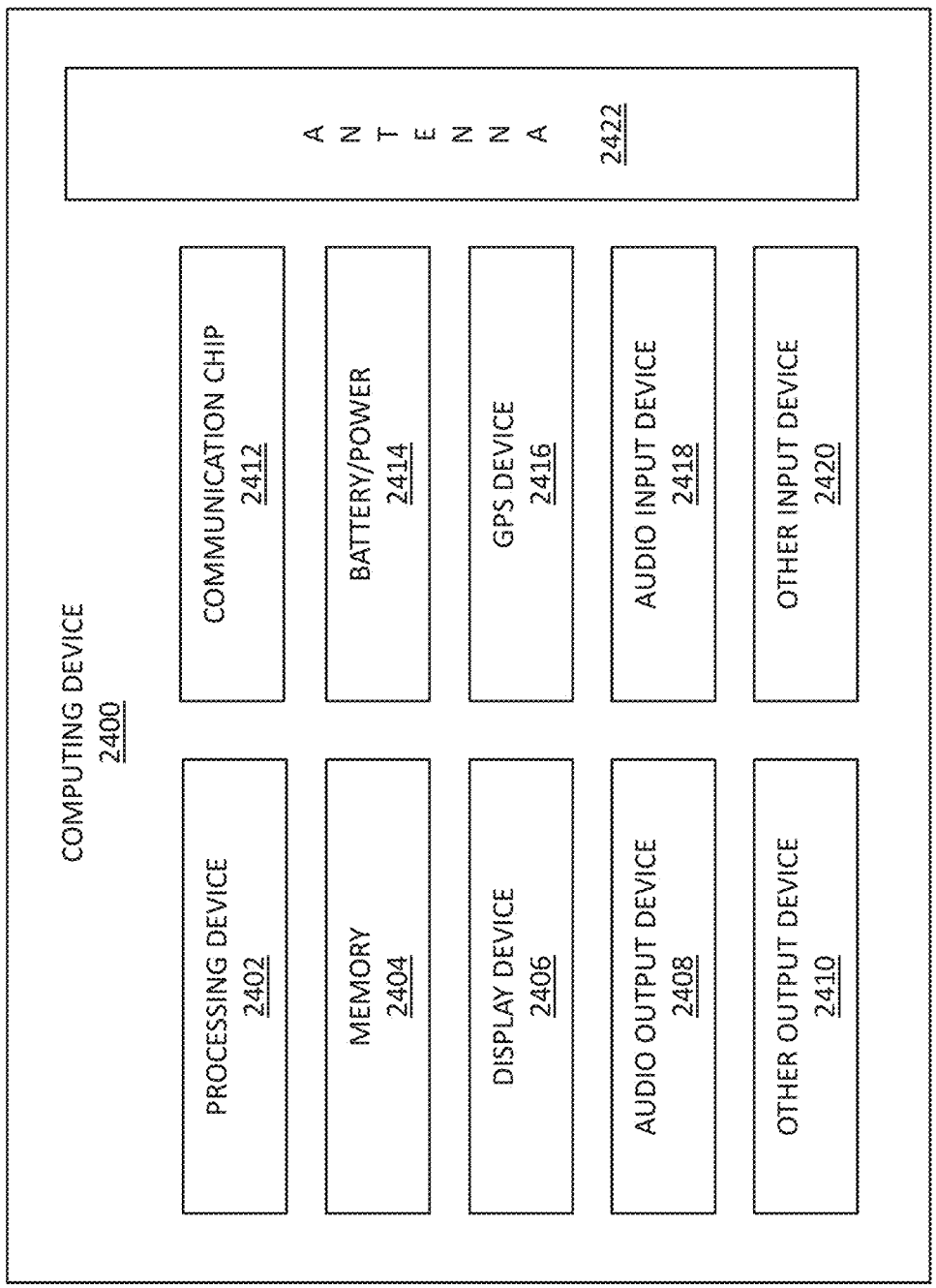
FIG. 13 is a block diagram of an example computing device that may include one or more 3D nanoribbon-based logic devices in accordance with any of the embodiments disclosed herein.

FIG. 13 is a block diagram of an example computing device 2400 that may include one or more components with one or more 3D nanoribbon-based logic devices in accordance with any of the embodiments disclosed herein. For example, any suitable ones of the components of the computing device 2400 may include a die (e.g., the die 2002 (FIG. 10B)) including one or more 3D arrays of nanoribbon-based DRAM cells in accordance with any of the embodiments disclosed herein. Any of the components of the computing device 2400 may include an IC package 2200 (FIG. 11). Any of the components of the computing device 2400 may include an IC device assembly 2300 (FIG. 12).

A number of components are illustrated in FIG. 13 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 13, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. At least parts of any components of the processing device 2402 may be implemented as the 3D nanoribbon-based logic devices described herein. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include, e.g., DRAM, SRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides an IC device that includes a support structure (e.g., a substrate); a first semiconductor nanoribbon (e.g., nanoribbon 202-2 shown in FIG. 5), extending in a direction substantially parallel to the support structure (where, in general, the term "nanoribbon" refers to an elongated semiconductor structure such as a nanoribbon or a nanowire, having a long axis parallel to the support structure); a second semiconductor nanoribbon (e.g., nanoribbon 202-3 shown in FIG. 5), extending in a direction substantially parallel to the support structure and stacked above the first nanoribbon so that the first nanoribbon is between the support structure and the second nanoribbon; a first transistor (e.g., transistor 210-22 shown in FIG. 5), including a first source or drain (S/D) region and a second S/D region in the first nanoribbon, and further including a gate stack at least partially surrounding a portion of the first nanoribbon between the first S/D region and the second S/D region of the first transistor; a second transistor (e.g., transistor 210-23 shown in FIG. 5), including a first S/D region and a second S/D region in the second nanoribbon, and further including a gate stack at least partially surrounding a portion of the second nanoribbon between the first S/D region and the second S/D region of the second transistor; and an inter-ribbon interconnect, configured to electrically couple the first S/D region of the first transistor and the second S/D region of the second transistor and including an elongated portion of an electrically conductive material having a long axis in a plane between a plane of the first nanoribbon and a plane of the second nanoribbon.

Example 2 provides the IC device according to example 1, where the elongated portion of the inter-ribbon interconnect includes a first end and a second end, the first end is electrically coupled to the second S/D region of the first transistor from a top side of the first nanoribbon, and the second end is electrically coupled to the first S/D region of the second transistor from a bottom side of the second nanoribbon. As used herein, the terms "top" and "bottom" refer to sides/locations which are, respectively, further away and closer to the support structure. For example, the top side of a given nanoribbon is further away from the nanoribbon than its bottom side.

Example 3 provides the IC device according to examples 1 or 2, where an electrical contact to the first S/D region of the first transistor is electrically discontinuous from an electrical contact to the second S/D region of the second transistor.

Example 4 provides the IC device according to any one of the preceding examples, where an electrical contact to the gate stack of the first transistor is electrically discontinuous from an electrical contact to the gate stack of the second transistor.

Example 5 provides the IC device according to any one of the preceding examples, where the gate stack of the first transistor forms a ring around the portion of the first nanoribbon that is between the first S/D region and the second S/D region in the first nanoribbon. Similarly, in further examples, the gate stack of the second transistor may form a ring around the portion of the second nanoribbon that is between the first S/D region and the second S/D region in the second nanoribbon.

Example 6 provides the IC device according to any one of the preceding examples, where the first nanoribbon includes a semiconductor material of a first type, the second nanoribbon includes a semiconductor material of a second type, one of the first type and the second type is an N-type semiconductor material and another one of the first type and the second type is a P-type semiconductor material.

Example 7 provides the IC device according to any one of the preceding examples, where the IC device further includes a third transistor (e.g., transistor 210-13 shown in FIG. 5), including a first S/D region and a second S/D region in the second nanoribbon, and further including a gate stack at least partially surrounding a further portion of the second nanoribbon between the first S/D region and the second S/D region of the third transistor, and the second S/D region of the second transistor is electrically coupled to, or is (e.g., is shared with), the first S/D region of the third transistor.

Example 8 provides the IC device according to any one of the preceding examples, where the IC device further includes a third semiconductor nanoribbon (e.g., nanoribbon 202-4 shown in FIG. 5), extending in a direction substantially parallel to the support structure and stacked above the second nanoribbon so that the second nanoribbon is between the first nanoribbon and the third nanoribbon, the IC device further includes a fourth transistor (e.g., transistor 210-24 shown in FIG. 5), including a first S/D region and a second S/D region in the third nanoribbon, and further including a gate stack at least partially surrounding a portion of the third nanoribbon between the first S/D region and the second S/D region of the fourth transistor, and the second S/D region of the second transistor is electrically coupled to the second S/D region of the fourth transistor.

Example 9 provides the IC device according to example 8, where the IC device further includes a fifth transistor (e.g., transistor 210-14 shown in FIG. 5), including a first S/D region and a second S/D region in the third nanoribbon, and further including a gate stack at least partially surrounding a further portion of the third nanoribbon between the first S/D region and the second S/D region of the fifth transistor, and the second S/D region of the fourth transistor is electrically coupled to, or is (e.g., is shared with), the first S/D region of the fifth transistor.

Example 10 provides the IC device according to example 8 (or example 9), where an electrical contact to the gate stack of the second transistor is electrically discontinuous from an electrical contact to the gate stack of the fourth transistor.

Example 11 provides an IC device that includes a support structure (e.g., a substrate, a chip, or a wafer); a plurality of elongated semiconductor structures (e.g., nanoribbons or nanowires) stacked above one another over the support structure and each having a long axis extending in a direction substantially parallel to the support structure; a plurality of transistors in each of the plurality of elongated semiconductor structures, each transistor including a first source or drain (S/D) region, a second S/D region, and a gate stack; individual contacts to the first S/D region, the second S/D region, and the gate stack to at least some of the plurality of transistors; and one or more inter-ribbon interconnects, each inter-ribbon interconnect including an electrically conductive trench portion between two elongated semiconductor structures stacked above one another, the trench portion extending in a direction substantially parallel to the support structure.

Example 12 provides the IC device according to example 11, where the plurality of elongated semiconductor structures include one or more elongated semiconductor structures of one or more of N-type semiconductor materials, and one or more elongated semiconductor structures of one or more of P-type semiconductor materials.

Example 13 provides the IC device according to examples 11 or 12, where the individual contacts to the gate stack of at least some of the plurality of transistors are formed in a staircase manner.

Example 14 provides the IC device according to any one of examples 11-13, where at least some of the plurality of transistors include a contact to the first S/D region on a top side of the transistor and a contact to the second S/D region on a bottom side of the transistor.

Example 15 provides the IC device according to any one of examples 11-14, where a distance between each pair of adjacent elongated semiconductor structures stacked above one another is between about 10 picometers and 1000 millimeters, e.g., between about 10 and 1000 nanometers, including all values and ranges therein.

Example 16 provides the IC device according to any one of examples 11-15, where the plurality of transistors form one or more logic gates.

Example 17 provides the IC device according to any one of examples 11-16, where a cross-section of at least some of the plurality of elongated semiconductor structures in a plane substantially perpendicular to the long axis of the structures is substantially rectangular. Thus, some of the plurality of elongated semiconductor structures may be semiconductor nanoribbons.

Example 18 provides the IC device according to any one of examples 11-16, where a cross-section of at least some of the plurality of elongated semiconductor structures in a plane substantially perpendicular to the long axis of the structures is substantially circular. Thus, some of the plurality of elongated semiconductor structures may be semiconductor nanowires.

Example 19 provides a method of forming an IC device, the method including providing a plurality of elongated semiconductor structures (e.g., nanoribbons or nanowires) stacked above one another over a support structure (e.g., a substrate, a chip, or a wafer), each elongated semiconductor structure having a long axis extending in a direction substantially parallel to the support structure; providing a plurality of transistors in each of the plurality of elongated semiconductor structures, each transistor including a first source or drain (S/D) region, a second S/D region, and a gate stack; providing individual contacts to the first S/D region, the second S/D region, and the gate stack to at least some of the plurality of transistors; and providing one or more inter-ribbon interconnects, each inter-ribbon interconnect including an electrically conductive trench portion between two elongated semiconductor structures stacked above one another, the trench portion extending in a direction substantially parallel to the support structure.

Example 20 provides the method according to example 19, where, for each of the plurality of transistors, the gate stack wraps around a respective portion of a respective elongated semiconductor structure, i.e., the transistors are gate-all-around (GAA) transistors.

Example 21 provides an IC package that includes an IC die, including one or more of the IC devices according to any one of the preceding examples. The IC package may also include a further component, coupled to the IC die.

Example 22 provides the IC package according to example 21, where the further component is one of a package substrate, a flexible substrate, or an interposer.

Example 23 provides the IC package according to examples 21 or 22, where the further component is coupled to the IC die via one or more first-level interconnects.

Example 24 provides the IC package according to example 23, where the one or more first-level interconnects include one or more solder bumps, solder posts, or bond wires.

Example 25 provides a computing device that includes a circuit board; and an IC die coupled to the circuit board, where the IC die includes one or more of the IC devices according to any one of the preceding examples (e.g., IC devices according to any one of examples 1-20), and/or the IC die is included in the IC package according to any one of the preceding examples (e.g., the IC package according to any one of examples 21-24).

Example 26 provides the computing device according to example 25, where the computing device is a wearable computing device (e.g., a smart watch) or handheld computing device (e.g., a mobile phone).

Example 27 provides the computing device according to examples 25 or 26, where the computing device is a server processor.

Example 28 provides the computing device according to examples 25 or 26, where the computing device is a motherboard.

Example 29 provides the computing device according to any one of examples 25-28, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
    a support structure;
    a first semiconductor nanoribbon, over the support structure;
    a second semiconductor nanoribbon, stacked above the first nanoribbon;
    a first transistor, comprising a first source or drain (S/D) region and a second S/D region in the first nanoribbon, and further comprising a gate stack at least partially surrounding a portion of the first nanoribbon between the first S/D region and the second S/D region of the first transistor;
    a second transistor, comprising a first S/D region and a second S/D region in the second nanoribbon, and further comprising a gate stack at least partially surrounding a portion of the second nanoribbon between the first S/D region and the second S/D region of the second transistor; and
    an inter-ribbon interconnect, configured to electrically couple the first S/D region of the first transistor and the second S/D region of the second transistor and comprising an elongated portion of an electrically conductive material extending in a plane that is between a plane of the first nanoribbon and a plane of the second nanoribbon.

2. The IC device according to claim 1, wherein:
    the elongated portion of the electrically conductive material of the inter-ribbon interconnect includes a first end and a second end,
    the first end is electrically coupled to the second S/D region of the first transistor from a top side of the first nanoribbon, and
    the second end is electrically coupled to the first S/D region of the second transistor from a bottom side of the second nanoribbon.

3. The IC device according to claim 1, wherein an electrical contact to the first S/D region of the first transistor is electrically discontinuous from an electrical contact to the second S/D region of the second transistor.

4. The IC device according to claim 1, wherein an electrical contact to the gate stack of the first transistor is electrically discontinuous from an electrical contact to the gate stack of the second transistor.

5. The IC device according to claim 1, wherein the gate stack of the first transistor forms a ring around the portion of the first nanoribbon that is between the first S/D region and the second S/D region in the first nanoribbon.

6. The IC device according to claim 1, wherein the first nanoribbon includes a semiconductor material of a first type, the second nanoribbon includes a semiconductor material of a second type, one of the first type and the second type is an N-type semiconductor material and another one of the first type and the second type is a P-type semiconductor material.

7. The IC device according to claim 1, wherein:
    the IC device further includes a third transistor, comprising a first S/D region and a second S/D region in the second nanoribbon, and further comprising a gate stack at least partially surrounding a further portion of the second nanoribbon between the first S/D region and the second S/D region of the third transistor, and
    the second S/D region of the second transistor is electrically coupled to, or is, the first S/D region of the third transistor.

8. The IC device according to claim 1, wherein:
    the IC device further includes a third semiconductor nanoribbon, extending in a direction parallel to the support structure and stacked above the second nanoribbon,
    the IC device further includes a fourth transistor, comprising a first S/D region and a second S/D region in the third nanoribbon, and further comprising a gate stack at least partially surrounding a portion of the third nanoribbon between the first S/D region and the second S/D region of the fourth transistor, and
    the second S/D region of the second transistor is electrically coupled to the second S/D region of the fourth transistor.

9. The IC device according to claim 8, wherein:
    the IC device further includes a fifth transistor, comprising a first S/D region and a second S/D region in the third nanoribbon, and further comprising a gate stack at least partially surrounding a further portion of the third nanoribbon between the first S/D region and the second S/D region of the fifth transistor, and
    the second S/D region of the fourth transistor is electrically coupled to, or is, the first S/D region of the fifth transistor.

10. The IC device according to claim 8, wherein an electrical contact to the gate stack of the second transistor is electrically discontinuous from an electrical contact to the gate stack of the fourth transistor.

11. The IC device according to claim 1, wherein the inter-ribbon interconnect being configured to electrically couple the first S/D region of the first transistor and the second S/D region of the second transistor includes the inter-ribbon interconnect having a first portion that is in physical contact with the first S/D region or a first S/D electrode of the first transistor and having a second portion that is in physical contact with the second S/D region or a second S/D electrode of the second transistor.

12. The IC device according to claim 1, wherein each of the first semiconductor nanoribbon, the second semiconductor nanoribbon, and the elongated portion of the inter-ribbon interconnect has a first axis, a second axis, and a third axis, where the first axis is perpendicular to each of the second axis and the third axis, and the second axis is perpendicular to the third axis,
    each of the first semiconductor nanoribbon, the second semiconductor nanoribbon, and the elongated portion of the inter-ribbon interconnect has a length in a direction of the first axis, a width in a direction of the second axis, and a thickness in a direction of the third axis, where the length is greater than each of the width and the thickness, and
    for each of the first semiconductor nanoribbon, the second semiconductor nanoribbon, and the elongated portion of the inter-ribbon interconnect, the first axis is substantially parallel to the support structure.

13. An integrated circuit (IC) device, comprising:
a support structure;
a plurality of elongated semiconductor structures stacked above one another over the support structure;
a plurality of transistors in each of the plurality of elongated semiconductor structures, each transistor including a first source or drain (S/D) region, a second S/D region, and a gate stack;
individual contacts to the first S/D region, the second S/D region, and the gate stack to at least some of the plurality of transistors; and
one or more inter-ribbon interconnects, each inter-ribbon interconnect comprising an electrically conductive trench portion between two elongated semiconductor structures stacked above one another,
wherein:
each of the plurality of elongated semiconductor structures and the trench portion has a first axis, a second axis, and a third axis, where the first axis is perpendicular to each of the second axis and the third axis, and the second axis is perpendicular to the third axis,
each of the plurality of elongated semiconductor structures and the trench portion has a length in a direction of the first axis, a width in a direction of the second axis, and a thickness in a direction of the third axis, where the length is greater than each of the width and the thickness, and
for each of the plurality of elongated semiconductor structures and the trench portion, the first axis is substantially parallel to the support structure.

14. The IC device according to claim 13, wherein the plurality of elongated semiconductor structures include:
one or more elongated semiconductor structures of one or more of N-type semiconductor materials, and
one or more elongated semiconductor structures of one or more of P-type semiconductor materials.

15. The IC device according to claim 13, wherein the individual contacts to the gate stack of at least some of the plurality of transistors are formed in a staircase manner.

16. The IC device according to claim 13, wherein at least some of the plurality of transistors include a contact to the first S/D region on a top side of the transistor and a contact to the second S/D region on a bottom side of the transistor.

17. The IC device according to claim 13, wherein a distance between each pair of adjacent elongated semiconductor structures stacked above one another is between 10 picometers and 100 millimeters.

18. The IC device according to claim 13, wherein the plurality of transistors form one or more logic gates.

19. A method of forming an integrated circuit (IC) device, the method comprising:
providing a first semiconductor nanoribbon over a support structure;
providing a second semiconductor nanoribbon, stacked above the first nanoribbon;
providing a first transistor, comprising a first source or drain (S/D) region and a second S/D region in the first nanoribbon, and further comprising a gate stack at least partially surrounding a portion of the first nanoribbon between the first S/D region and the second S/D region of the first transistor;
providing a second transistor, comprising a first S/D region and a second S/D region in the second nanoribbon, and further comprising a gate stack at least partially surrounding a portion of the second nanoribbon between the first S/D region and the second S/D region of the second transistor; and
providing an inter-ribbon interconnect, configured to electrically couple the first S/D region of the first transistor and the second S/D region of the second transistor and comprising an elongated portion of an electrically conductive material in a plane that is between a plane of the first nanoribbon and a plane of the second nanoribbon,
wherein:
each of the first semiconductor nanoribbon, the second semiconductor nanoribbon, and the elongated portion of the inter-ribbon interconnect has a first axis, a second axis, and a third axis, where the first axis is perpendicular to each of the second axis and the third axis, and the second axis is perpendicular to the third axis,
each of the first semiconductor nanoribbon, the second semiconductor nanoribbon, and the elongated portion of the inter-ribbon interconnect has a length in a direction of the first axis, a width in a direction of the second axis, and a thickness in a direction of the third axis, where the length is greater than each of the width and the thickness, and
for each of the first semiconductor nanoribbon, the second semiconductor nanoribbon, and the elongated portion of the inter-ribbon interconnect, the first axis is substantially parallel to the support structure.

20. The method according to claim 19, further including:
providing a third semiconductor nanoribbon, extending in a direction parallel to the support structure and stacked above the second nanoribbon, and
providing a fourth transistor, comprising a first S/D region and a second S/D region in the third nanoribbon, and further comprising a gate stack at least partially surrounding a portion of the third nanoribbon between the first S/D region and the second S/D region of the fourth transistor,
where the second S/D region of the second transistor is electrically coupled to the second S/D region of the fourth transistor.

* * * * *